United States Patent
Schaaf et al.

(10) Patent No.: US 9,383,016 B2
(45) Date of Patent: Jul. 5, 2016

(54) SEALING ELEMENT AND A SEALING SYSTEM FOR HOLLOW SECTIONS

(75) Inventors: Igor Harry Schaaf, Rheinmuenster (DE); Paul Mazura, Karlsbad (DE); Walter Nicolai, Buseck (DE); Simon Jocham, Munich (DE)

(73) Assignee: C E S CONTROL ENCLOSURE SYSTEMS GMBH, Bad Homburg v.d. Hoehe (DE)

( * ) Notice: Subject to any disclaimer, the term of this patent is extended or adjusted under 35 U.S.C. 154(b) by 190 days.

(21) Appl. No.: 14/001,502

(22) PCT Filed: Feb. 22, 2012

(86) PCT No.: PCT/EP2012/000769
§ 371 (c)(1),
(2), (4) Date: Oct. 17, 2013

(87) PCT Pub. No.: WO2012/113551
PCT Pub. Date: Aug. 30, 2012

(65) Prior Publication Data
US 2014/0367923 A1 Dec. 18, 2014

(30) Foreign Application Priority Data

Feb. 25, 2011 (DE) .......................... 10 2011 012 433
Feb. 25, 2011 (DE) .......................... 10 2011 012 434
Feb. 25, 2011 (DE) .......................... 10 2011 012 435
Feb. 25, 2011 (DE) .......................... 10 2011 012 436

(51) Int. Cl.
*F16J 15/02* (2006.01)
*H02B 1/28* (2006.01)
(Continued)

(52) U.S. Cl.
CPC ................. *F16J 15/022* (2013.01); *H02B 1/28* (2013.01); *H02B 1/301* (2013.01); *H05K 9/0015* (2013.01); *H02B 1/013* (2013.01)

(58) Field of Classification Search
CPC ........................................................ F16J 15/46
USPC .......................................... 277/921; 49/493.1
See application file for complete search history.

(56) References Cited

U.S. PATENT DOCUMENTS 2,446,336 A * 8/1948 Mark .................... E05C 19/161
252/62.53
5,008,485 A * 4/1991 Kitagawa ............. H05K 9/0015
174/356
(Continued)

FOREIGN PATENT DOCUMENTS

DE 1936096 A1 6/1970
DE 19528362 A1 2/1996
(Continued)

OTHER PUBLICATIONS

Certificate of Grant dated Feb. 9, 2016, issued in Russian Application No. 2013141506/07.
(Continued)

*Primary Examiner* — Kristina Fulton
*Assistant Examiner* — L. Susmitha Koneru
(74) *Attorney, Agent, or Firm* — Carter, DeLuca, Farrell & Schmidt, LLP

(57) ABSTRACT

The present disclosure relates to a sealing element for hollow sections, including a seal carrier that extends along a longitudinal axis and has two arms each of which has an outer face and an inner face and which are connected together, as one piece, at longitudinal edges that face each other such that they form a corner angle between them seals mounted on or near a free longitudinal edge of each arm and running parallel to the free longitudinal edge, on the outer face of the associated arm, and a securing device, on at least one inner face of an arm, for detachably securing the sealing element onto a corner of a hollow section. A cover cap serves to complete the sealing elements, the cap being provided, on its outer face, with one or more sealing sections designed to connect to ends of the seals of the sealing element.

12 Claims, 3 Drawing Sheets

(51) Int. Cl.
  *H02B 1/30* (2006.01)
  *H05K 9/00* (2006.01)
  *H02B 1/01* (2006.01)

(56) References Cited

U.S. PATENT DOCUMENTS

| | | | |
|---|---|---|---|
| 5,202,818 A | 4/1993 | Betsch et al. | |
| RE34,393 E * | 9/1993 | McIlwraith | H05K 7/183 312/265.4 |
| 5,321,928 A | 6/1994 | Warneke | |
| 5,775,051 A * | 7/1998 | Nicolai | H02B 1/28 52/281 |
| 5,806,946 A * | 9/1998 | Benner | H05K 7/183 312/265.3 |
| 5,932,843 A * | 8/1999 | Besserer | H02B 1/38 174/50 |
| 6,231,142 B1 | 5/2001 | Pochet | |
| 6,527,278 B1 * | 3/2003 | Norris | E06B 7/2301 277/628 |
| 6,561,555 B1 | 5/2003 | Millard | |
| 6,945,540 B2 | 9/2005 | Bormann | B60J 10/233 277/644 |
| 7,267,378 B2 | 9/2007 | Drumm | |
| 7,575,195 B2 * | 8/2009 | Eveker | B64C 1/14 244/129.5 |
| 8,046,857 B2 * | 11/2011 | Whitley | B65G 69/287 14/69.5 |
| 2004/0108040 A1 * | 6/2004 | Field | B29C 65/0618 156/73.6 |
| 2007/0052333 A1 * | 3/2007 | Freire | A47B 47/005 312/265.4 |
| 2007/0175120 A1 * | 8/2007 | Lenhardt | E06B 3/66361 52/204.62 |
| 2008/0263973 A1 * | 10/2008 | Lenhardt | E06B 3/667 52/204.591 |
| 2009/0025954 A1 * | 1/2009 | Stock | E05D 5/0215 174/61 |
| 2009/0260311 A1 | 10/2009 | Boyer et al. | |
| 2009/0277111 A1 * | 11/2009 | Albrecht | E05B 63/0052 52/213 |
| 2010/0000157 A1 | 1/2010 | Cotlet et al. | |
| 2011/0099912 A1 * | 5/2011 | Ohtake | B60J 10/88 49/502 |
| 2011/0232226 A1 * | 9/2011 | Geyer | B66B 7/023 52/831 |
| 2011/0248014 A1 * | 10/2011 | Chubb | H05B 3/84 219/213 |
| 2011/0272895 A1 * | 11/2011 | Kritzer | H01M 2/08 277/630 |
| 2012/0324770 A1 * | 12/2012 | Cappelle | B44D 3/185 38/102.4 |
| 2013/0168995 A1 * | 7/2013 | Kobayashi | B60J 10/042 296/146.2 |
| 2013/0256251 A1 * | 10/2013 | Oboza | H02B 1/014 211/182 |
| 2013/0306584 A1 * | 11/2013 | Hofmann | H02B 1/01 211/182 |
| 2014/0144090 A1 * | 5/2014 | Rebman | E06B 3/28 52/203 |

FOREIGN PATENT DOCUMENTS

| | | |
|---|---|---|
| DE | 295 17 327 U1 | 3/1997 |
| DE | 198 53 611 C1 | 4/2000 |
| DE | 102008020148 A1 | 10/2008 |
| EA | 0 402 276 A1 | 12/1990 |
| EP | 0330758 A1 | 9/1989 |
| EP | 1659250 A1 | 5/2006 |
| SU | 129694 | 6/1962 |
| SU | 173285 | 9/1965 |
| WO | 2005052416 A1 | 6/2005 |

OTHER PUBLICATIONS

International Search Report issued in corresponding application No. PCT/EP2013/000768 mailed Jun. 28, 2012.
International Search Report issued in corresponding application No. PCT/EP2012/000769 mailed Jul. 3, 2012.

* cited by examiner

SEALING ELEMENT AND A SEALING SYSTEM FOR HOLLOW SECTIONS

The invention relates to a sealing element for hollow sections and also to a sealing system for hollow sections which comprises such sealing elements.

Hollow sections, which may consist of metal or plastic for example, are suitable for manufacturing frames and racks such as are needed in various fields of application, for instance in the electrical industry (e.g. as frame elements for switch cabinets), in machine and plant construction (for instance as a machine under-frame or the like), but also in the furniture industry (for example for rack systems and the like). Hollow sections of the aforesaid type may be shaped from sheet metal, but said sections may also be continuous castings (made of aluminium or plastic, for instance). Irrespective of the way in which they are manufactured and the material of which they consist, the hollow sections, which are usually elongated, nevertheless have to be connected, at their ends, to other hollow sections in order to form, for example, a frame, a rack or the like.

It is often necessary for a rack or frame consisting of hollow sections to be provided with side parts in order to create a closed interior space within the frame or rack. If this interior space is to be sealed off from the environment, seals have to be provided between each wall element and the hollow section to which it is secured. For this purpose, it is possible, for example, for each wall element to be provided, on its inner face that faces towards the hollow section, with a seal which comes into sealing abutment with the hollow section when the wall element is secured, or else a seal with which the wall element comes into contact for sealing purposes may be present directly on the hollow section.

The underlying object of the invention is to indicate a solution which is simple to assemble and convincingly functional and which makes it possible to selectively equip a hollow section with a seal in order, for example, to prevent the ingress of dust and/or moisture into an interior space formed by an arrangement of hollow sections, it being optionally possible, in addition, to permit electromagnetic screening as well (in order to obtain so-called "electromagnetic compliance", referred to as "EMC" for short).

This object is achieved, according to the invention, by means of a sealing element for hollow sections which comprises a seal-carrier that extends along a longitudinal axis and has two arms, each of which has an outer face and an inner face and which are connected together, as one piece, at longitudinal edges that face each other, such that they form a corner angle between them, wherein said sealing element further comprises seals mounted on or near a free longitudinal edge of each arm and running parallel to said free longitudinal edge, on the outer face of the arm in question, and wherein said sealing element finally has a securing device, on at least one inner face of an arm, for detachably securing the sealing element on a corner of a hollow section.

According to the invention, therefore, sealing which is necessary is not provided on a wall element which is to be secured, and not even directly on a hollow section itself. Instead, any sealing which may be necessary is achieved by means of an additional sealing element which can be secured to a corner region of a hollow section and is provided on its outer face, on or near the free longitudinal edges, with seals which bring about desired sealing between a hollow section and a wall element which is to be secured to it. According to the invention, sealing elements may be manufactured as material which is sold by the meter and may be made up beforehand in any desired length. Hollow sections which are intended to be provided with sealing later on are no different, according to the invention, from hollow sections of this kind which are used without sealing. Instead, it is possible to decide, according to requirements, whether sealing is to be present or not, by either using, or refraining from using, sealing elements according to the invention. Sealing may optionally also take place afterwards, in which case all that is necessary is to take off wall elements that have already been fitted to a hollow-section frame, and to re-secure them after attaching the sealing elements.

In some forms of embodiment of sealing elements according to the invention, the free longitudinal edge of each arm may be coated with a sealing material, for instance with a suitable elastomer material. In this way, sealing is brought about both on the outer face and on the inner face of each arm. In other forms of embodiment, the seals are mounted only on the outer face of the arm in question. The seals may be attached to the arm by bonding, clamping, fusion or some other suitable method of attachment.

The securing device on the inner face of at least one arm, by means of which device the sealing element as a whole can be secured on a corner of a hollow section, may function, for example, after the manner of a hook-and-loop fastener, may be brought about by plug-in or latching connections between the sealing element and the hollow section, or may be brought about by bonding or even by mechanical securing means such as screws or the like.

In one preferred configuration of a sealing element according to the invention, the two arms consist of elastic material and the corner angle formed between said two arms is slightly smaller than a corner angle which is formed by that corner of the hollow section on which the sealing element is to be secured. If, for example, the hollow section has a corner region with a 90-degree angle, the corner angle of the sealing element is slightly smaller than 90 degrees in this form of embodiment. In a form of embodiment of this kind, the securing device is formed by at least two clamping surfaces, of which one is constructed, in each case, on the inner face of each arm. Each clamping surface extends, at a distance from the longitudinal edges of the arms that face one another, parallel to the longitudinal axis of the sealing element, a clamping angle being formed between the clamping surface and the inner face of the arm in question. Each clamping surface is thus configured in order to interact with a complementary bearing surface on the outer face of the hollow section. Because the corner angle formed between two arms of the sealing element is slightly smaller than the corner angle of the hollow section, the two arms are forced apart slightly when the sealing element is pressed onto the corner region of the hollow section, as a result of which a tensioning force is generated which attempts to re-establish the original state and therefore presses each clamping surface of the sealing element against the associated bearing surface on the hollow section. In this way, the sealing element is held on said hollow section in a clamping manner.

In some forms of embodiment of the sealing element according to the invention, at least one seal is arranged in a longitudinally extending recess on the outer face of the associated arm, one longitudinal edge of said recess, which is closer than the other edge to those longitudinal edges of the arms which face one another and at which the two arms are connected together, being formed by the rear face of the clamping surface of the said arm. In this way, the rear face of the clamping surface forms a lateral support for the seal and, at the same time, ensures satisfactory positioning of said seal. The other longitudinal edge of the recess may likewise perform a supporting and positioning function; however it need not do so, but may also be arranged in one plane with the free longitudinal edge of the arm in question.

According to one preferred further development of a sealing element according to the invention, there protrudes, from the outer face of at least one of the arms, a web which extends parallel to the longitudinal axis and forms, between itself and the outer face of the associated arm, a spring angle of less than 90 degrees. Said web therefore normally does not protrude in relation to the outer face of the arm, but is inclined towards one or other longitudinal edge of said arm, preferably towards the longitudinal edge at which the two arms are connected together as one piece. This being the case, the web is arranged in such a way that the seal, which is likewise arranged on the arm, is located closer to the free longitudinal edge of the associated arm than the web is. What is achieved in this way is that, when the sealing element is in the fitted state, the seal is located, as it were, behind the web, and the latter is therefore able to protect the seal against, for instance, mechanical damage, liquid impinging in a jet-like manner, etc. The amount by which the web protrudes is preferably chosen in such a way that a wall element which is to be secured comes into contact with the free longitudinal edge of the web first, and only after that, i.e. in the course of the further attachment of the wall element, with the seal which is located on the web. Said web is therefore pressed slightly in the direction of the sealing element by a wall element which is to be secured, as a result of which its free longitudinal edge rests elastically, in a resilient manner, against the inner face of the wall element.

If, in addition to sealing against, for example, dust and/or moisture, further protection against electromagnetic radiation (EMC) is desired, a sealing element according to the invention preferably consists of an electrically conductive material, for instance a metal or an electrically conductive plastic. Alternatively it is possible, if the sealing element consists of a material which is not electrically conductive, to apply an electrically conductive coating to its outer face, including the seals. This may be a film which is applied in a suitable manner, but the electrically conductive coating may preferably be vapour-deposited. Irrespective of the previously described embodiments ensuring electrical conductivity, it is thus achieved that the interior space, which is formed by the arrangement of hollow sections, is protected after the manner of a Faraday cage if the wall elements to be secured are likewise electrically conductive.

If the material from which the sealing element according to the invention is to be manufactured is suitable for being extruded, preferred forms of embodiment of sealing elements according to the invention are designed as a so-called "2C extruded part". What is meant by the term "2C extruded part" is a part which is manufactured by means of a single extruding operation and the material of which consists of two components, of which one component is a fairly hard and stable material which forms the seal-carrier, including any webs that protrude from it, and of which the second component is a resiliently elastic material from which the seals are formed. These two-component extrusion processes are known to persons skilled in the art, so that there is no need to explain in greater detail here how such an extrusion process can be carried out.

If frames or racks are formed from hollow sections, use may be made, for the purpose of connecting a number of hollow sections to the corner of a frame or rack, of so-called "corner connectors" such as are described, for instance, in the German patent application by the same Applicant entitled "Corner connectors for hollow sections". So that satisfactory sealing and, if desired, protection against electromagnetic radiation (EMC) is guaranteed, even in such corner regions, use may be made according to the invention, in each of the said corner regions in which a number of hollow sections are connected by means of a corner connector, of a cover cap which is provided, on its outer face, with one or more sealing sections which are constructed for connection to ends of the seals which are present on the sealing element. Sealing elements according to the invention and at least one cover cap according to the invention thus form a sealing system for hollow sections which is simple to assemble and dismantle and offers all-round protection against unwanted environmental influences. Each cover cap is preferably configured in such a way that it can be slipped onto the corner connector, the outer surfaces of said cover cap being located in the same plane as adjacent surfaces of the hollow sections which are connected by means of the corner connector. The outer faces of the cover cap thus constitute a continuation of the development of the hollow-section surfaces and form the actual corner of the frame or rack. For the purpose of connection to the seals of a sealing element, the sealing sections mounted on the outer face of the cover cap may have extensions which can be introduced into an inner cavity in a seal belonging to a sealing element.

A cover cap according to the invention, including the sealing sections present on it, preferably consists of an electrically conductive material, so that protection against electromagnetic radiation (EMC) is made possible. Alternatively, an electrically conductive coating may be applied, for this purpose, to the outer face of the cover cap, including its sealing sections.

A currently preferred embodiment of a sealing system according to the invention for hollow sections will be explained in greater detail below with the aid of the appended diagrammatic drawings, in which.

Figure 1:
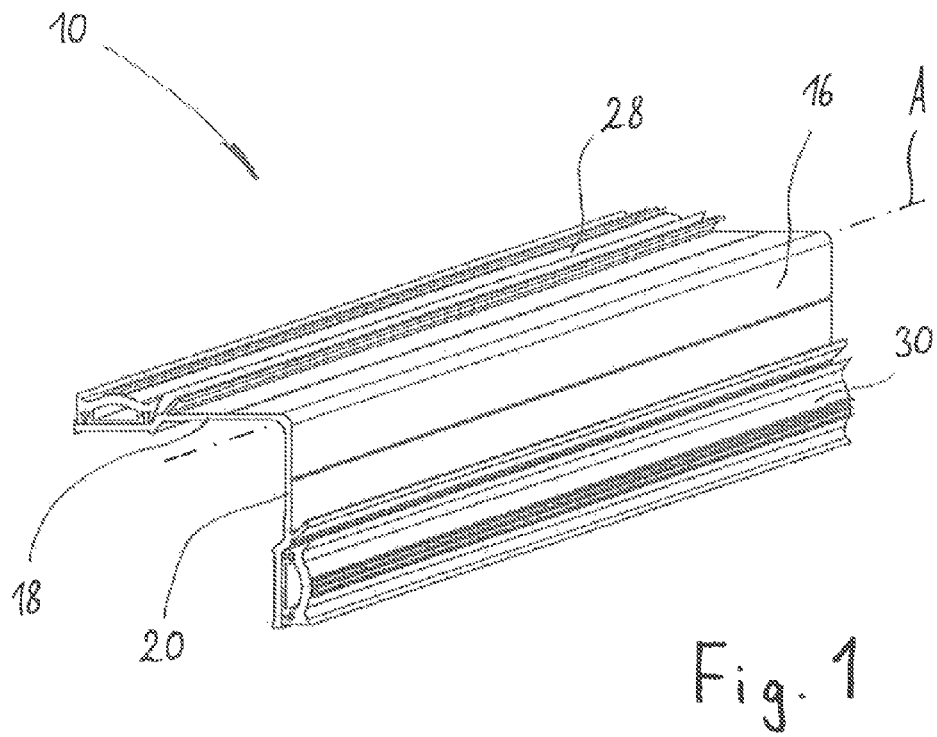
FIG. 1 shows a sealing element for a hollow section, in a three-dimensional representation.
Figure 2:
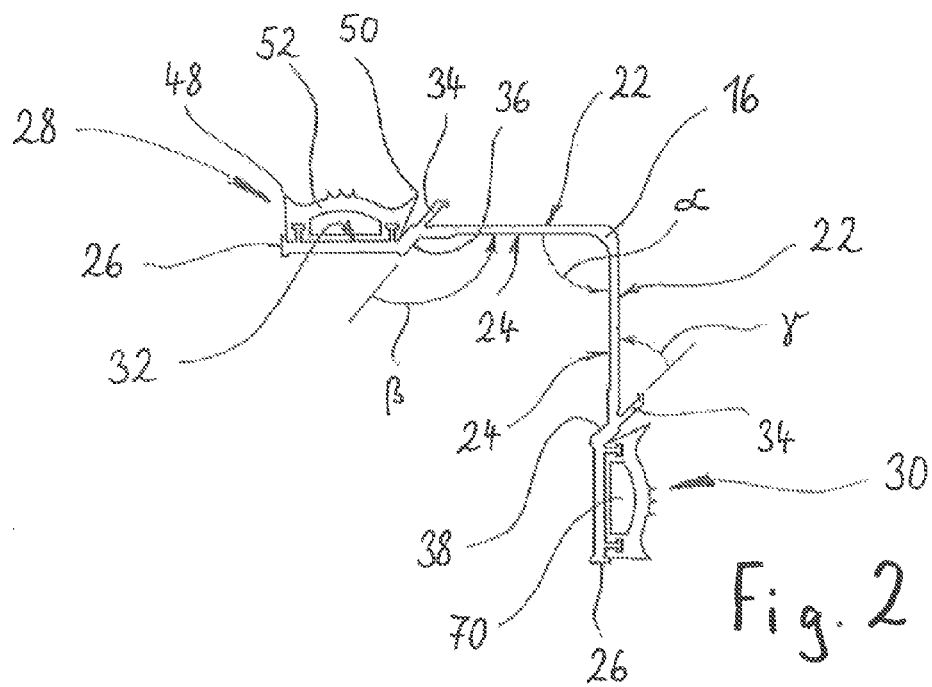
FIG. 2 shows an end view of the sealing element from FIG. 1.
Figure 3:
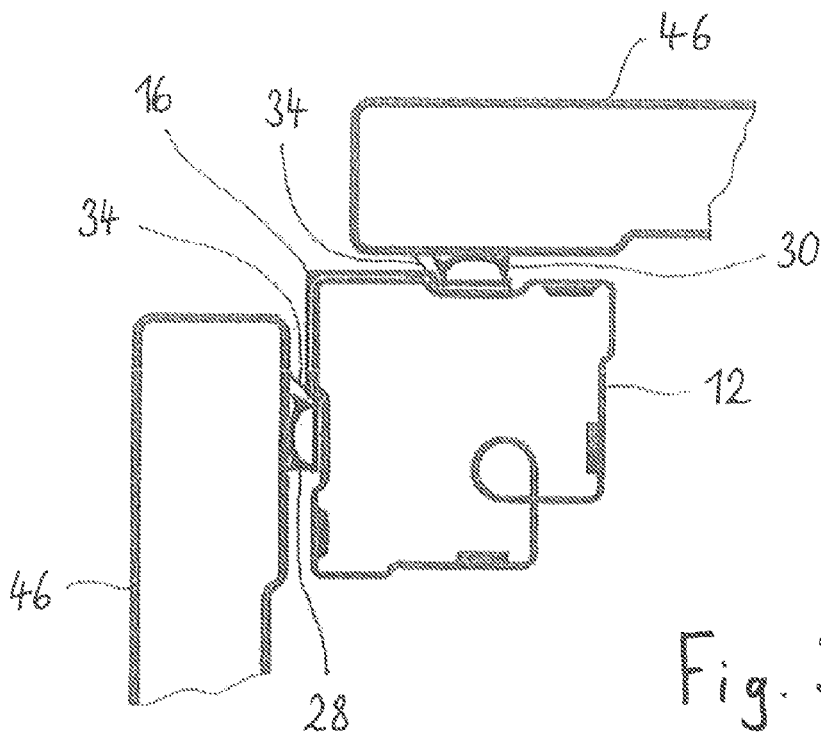
FIG. 3 shows a cross-section through a hollow section with a sealing element according to FIG. 1 mounted on it, two wall elements also being secured to said hollow section.
Figure 5:
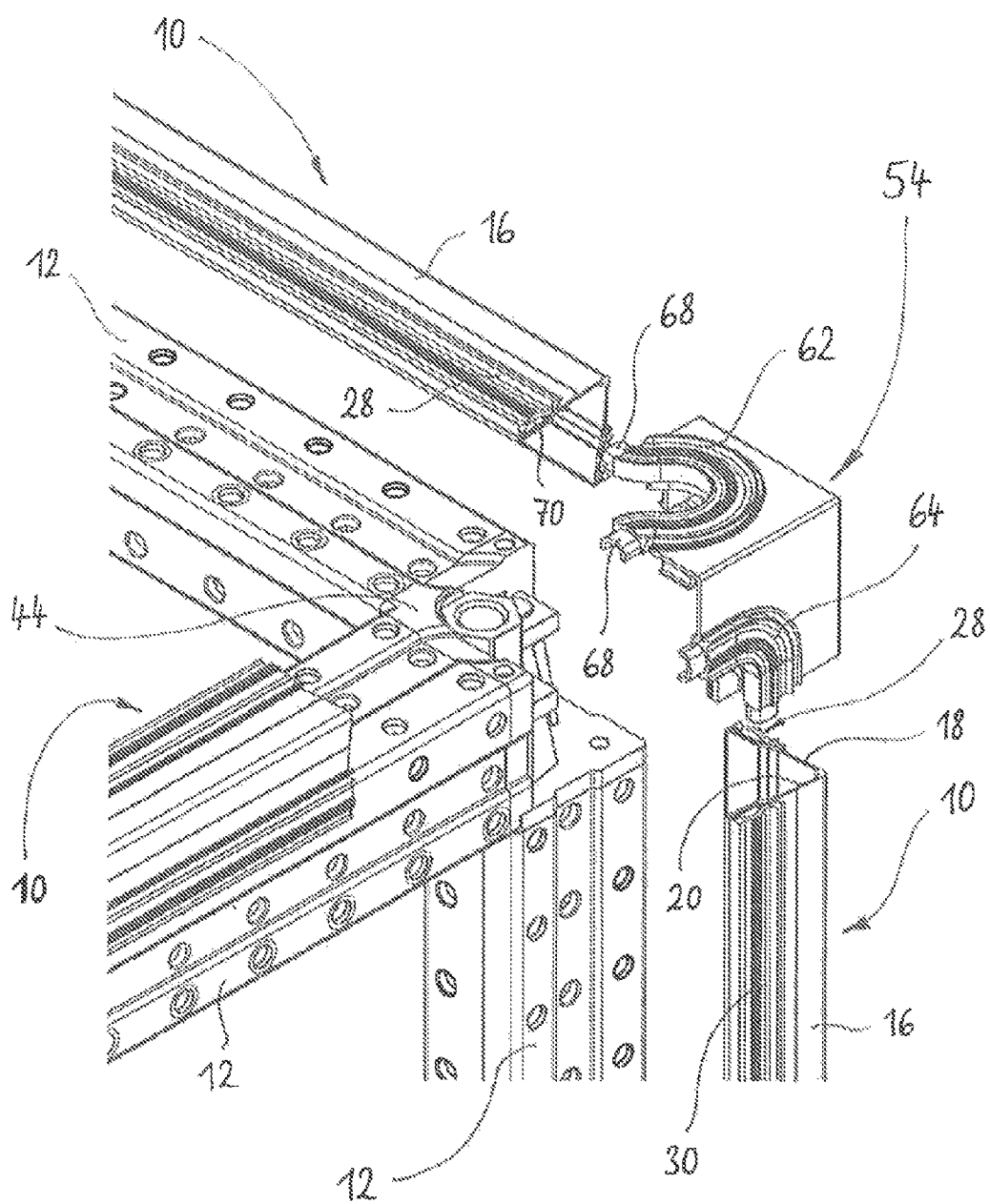
FIG. 5 shows a three-dimensional exploded representation of a frame corner region consisting of three hollow sections which are connected together by a corner connector.

FIGS. 1 and 2 show a sealing element, which is designated generally by 10, for a hollow section 12 such as is represented, for example, in FIGS. 3 and 5. As can be seen in FIG. 2, the sealing element 10 is intended to be attached to a lateral edge 14 of the hollow section 12, which edge forms a corner.

The sealing element 10 has a seal-carrier 16 which extends along a longitudinal axis A and is formed from two arms 18, 20 which each have an outer face 22 and an inner face 24. The two arms 18, 20 are connected together, as one piece, at longitudinal edges that face each other, such that they form a corner angle α between them which, in the embodiment shown, is slightly smaller than 90 degrees.

Mounted on the outer face 22, adjacent to a free longitudinal edge 26 of each arm 18, 20, is a seal 28, 30 which runs parallel to the longitudinal axis A, and thereby parallel to the free longitudinal edge 26, and the function of which will be further explained in greater detail later on. In the embodiment shown, each seal 28, 30 is received and supported in a longitudinally extending recess 32.

Parallel to an inner longitudinal edge of each recess 32 that is closer to those longitudinal edges of the arms 18, 20 which are connected together, a web 34 projects upwards, close to the seal 28 or 30, from the outer face 22 of the arm 18 or 20, respectively. Said web 34 runs parallel to the longitudinal axis A and thereby parallel to the seal 28 or 30, respectively, and is so arranged that a spring angle γ of less than 90 degrees is formed between said web and the outer face 22 of the arm 18, 20 in question. The function of the said webs 34, which, in an un-deformed state, jut out slightly beyond the associated seal 28, 30, will be explained further.

Constructed, in each case, on the inner face 24 of each arm 18, 20 is a clamping surface 36, 38 which is arranged obliquely in relation to the associated arm and which runs parallel to the longitudinal axis A, at a distance from those longitudinal edges of the arms 18, 20 which are connected together, and forms a clamping angle β between itself and the inner face 24 of the respective arm 18, 20. As will be further explained later on, the said clamping surfaces 36, 38 interact with bearing surfaces 40, 42 on the outer face of the hollow section 12 in order to secure the sealing element 10 to said hollow section 12. In the embodiment shown, those rear sides of the clamping surfaces 36, 38 which are located on the outer face 22 form the inner longitudinal edge of the recesses 32.

Basically, the seal-carrier 16 may be manufactured from a series of different materials. For example, the seal-carrier 16 may be a part made of steel or even an aluminium section or a section made of some other metal. The seals 28, 30 may be separate components which are inserted in the recesses 32, or are securely clamped or securely bonded within them. Other methods of attachment for the seals 28, 30 are likewise possible.

In the embodiment shown, the seal-carrier 16 consists of a stable and, at the same time, elastic plastic which is suitable for the particular intended application and which is manufactured, together with the seals 28, 30, as a so-called "two-component extruded part". This being the case, the seals 28, 30 consist of a different material from the seal-carrier 16, preferably of an elastomer material which is known for manufacturing elastic seals. Because of the integrated extrusion process, by means of which both the seal-carrier 16 and the seals 28, 30 are produced together, said seals 28, 30 are already fused to said seal-carrier 16 because of the temperature prevailing during extrusion, and no longer need to be attached separately. By means of a two-component extrusion process of this kind, sealing elements 10 can be manufactured, as it were, continuously and be cut to desired lengths afterwards.

The function of sealing elements 10 will now be explained in greater detail with particular reference to FIGS. 3 and 5. In this connection, FIG. 5 shows three hollow sections 12 which are arranged in pairs at right angles to one another and form the corner of a frame, of which no further details are represented. For the purpose of connecting the three hollow sections 12 in the corner region, use is made, by way of an example, of a corner connector 44 such as is shown and described in the German patent application by the same Applicant entitled "Corner connectors for hollow sections", but which may also be of a different design so long as it is ensured that said corner connector connects the three hollow sections 12 together in a reliable and stable manner.

FIG. 3 shows a section through the hollow section 12, which is the lower one in FIG. 5, outside the region in which the corner connector 44 is arranged, and reveals that, in the finished state, wall elements 46, which close an interior space surrounded by the frame, are secured externally to the hollow sections 12. The said interior space is reliably screened against environmental influences by means of the sealing elements 10.

In order to obtain the desired sealing, a sealing element 10 is attached to the lateral edge 14 of each hollow section 12, as represented in FIG. 5. Since, in the example shown, the corner angle of the hollow sections amounts to 90 degrees, but the corner angle α of the sealing elements 10 is slightly smaller, said sealing elements 10 are expanded slightly on being slipped onto the hollow sections 12, i.e. the arms 18, 20 are pressed apart slightly. Because the material of which the seal-carrier 16 consists is elastic, this expansion results in a spring force which forces the arms 18, 20 towards one another and thereby presses the clamping surfaces 36, 38 on the inner face 24 of the sealing element 10 against the bearing surfaces 40, 42 on the hollow section 12. By means of this clamping action, each sealing element 10 is held on the hollow section 12 in a secure yet easily detachable manner.

The assembled state of a sealing element 10 is visible from FIG. 3. It can be seen that the inner face 24 of the sealing element 10 is constructed in a manner complementary to the outer face of the hollow section 12, so that the sealing element 10 clings to said outer face of the hollow section 12. As soon as the sealing element 10 is mounted on the hollow section 12, the seals 28, 30 are automatically located in a position in which they can come into contact with the inner face of the wall elements 46.

When a wall element 46 is secured to the hollow section 12, the inner face of said wall element 46 first of all comes into contact with the free edge of the web 34. In the course of further securing of the wall element 46, which takes place, for example, by tightening screws which are not represented here, the distance between the inner face of the wall element 46 and the outer face 22 of the sealing element 10 is reduced, so that the web 34 is deformed slightly, as a result of which the spring angle γ is slightly diminished. When the wall element 46 is completely secured to the hollow section 12, therefore, a spring force, which presses the free longitudinal edge of the web 34 against the inner face of the wall element 46 and in this way forms initial sealing, for example against splashes of water, operates within the web 34 which consists of the elastic material of the seal-carrier 16. When the wall element 46 is in the state in which it is completely secured to the hollow section 12, the outer face of the seals 28, 30 is also in resilient contact with the inner face of the wall element 46 in question, thereby forming second sealing which constitutes the actual sealing. In the embodiment shown, each seal 28, 30 is formed by a hollow section of the seal that has, on its outer face, two sealing lips 48, 50 and, between them, a convexly curved sealing region 52, the outer face of which, when in the fitted state, is in linear or strip-shaped contact with the inner face of a wall element 46.

Figure 4:
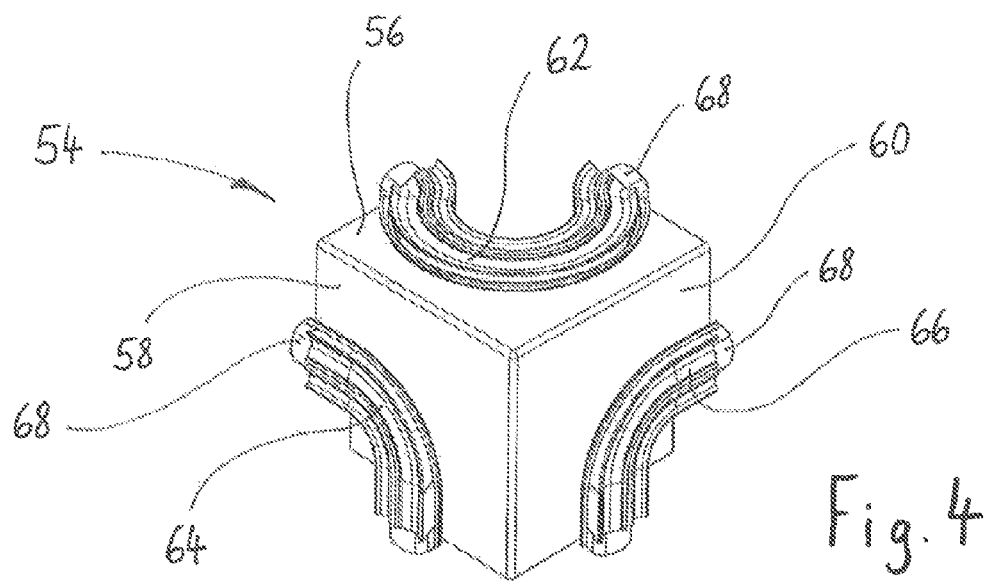
FIG. 4 shows a cover cap for completing sealing that has been achieved by means of sealing elements from FIG. 1.

Also shown, in FIGS. 4 and 5, is a cover cap 54 which completes sealing that is achieved by means of the sealing elements 10. Said cover cap 54 consists of three wall sections 56, 58, 60 which are connected together as one piece and at right angles to one another and on the outer face of which there is secured, in each case, a sealing section 62, 64, 66, of which only the sealing sections 62 and 64 are visible in FIG. 5. The material from which the wall sections 46, 58, 60 of the cover cap 54 are formed, may be the same material from which the seal-carrier 16 of the sealing elements 10 has also been manufactured; however, use may also be made of a material which is different from that of said seal-carrier 16. The wall sections 56, 58, 60 may, for example, also consist of metal, although the material of the seal-carrier 16 is a plastic in the embodiment shown. The material of which the sealing sections 62, 64, 66 consist is preferably the same material from which the seals 28, 30 are also produced.

The cover cap 54 is configured in order to be secured on the corner connector 44, for example by latching. In the state in which they are secured to the corner connector 44, the wall sections 56, 58, 60 of the cover cap 54 substantially constitute a continuation of the relevant outer surfaces of the hollow sections 12 that have been connected together by means of the corner connector 44. The actual corner of the frame formed by the hollow sections 12 is thus located on the cover cap 54 at the point at which all three wall sections 56, 58, 60 meet.

As is represented, the sealing sections 62, 64, 66 are of curved design in such a way that they each connect together two seals 28 or 30 of adjoining sealing elements 10. In order to produce a reliable connection between the sealing sections 62, 64, 66 and associated seals 28, 30, the ends of each sealing section 62, 64, 66 are each provided with a projection 68, which can be introduced, when the cover cap 54 is secured to the corner connector 44, into a cavity 70 which is formed by the sealing section of which the seals 28, 30 consist.

Cover caps 54 provided with the sealing sections 62, 64, 66 may be used to advantage on a frame formed from hollow sections 12, even when no sealing elements 10 are used, because said sealing sections 62, 64, 66 may then serve, e.g., as soft stops for a door, for example, which is secured to the frame.

The invention claimed is:

1. A sealing element for hollow sections, comprising:
   a seal-carrier that extends along a longitudinal axis and has two arms, each arm having an outer face and an inner face and the two arms being-connected together, as one piece, at longitudinal edges that face each other, such that they form a spring angle slightly smaller than 90 degrees between them;
   seals which are mounted on or near a free longitudinal edge of each arm, in a manner running parallel to the free longitudinal edge, on the outer face of the corresponding arm; and
   at least two clamping surfaces forming a clamping device each of the at least two clamping surfaces on the inner face of a corresponding one of the arms, each of the at least two clamping surfaces extending a distance from the longitudinal edge of the corresponding arm parallel to the longitudinal axis, each of the at least two clamping surfaces forming an obtuse clamping angle with the inner face of the corresponding arm.

2. The sealing element according to claim 1, wherein the two arms consist of elastic material, and wherein the spring angle is slightly smaller than a corner angle which is formed by a corner of the hollow section on which the sealing element is to be secured.

3. The sealing element according to claim 1, wherein each seal is arranged in a longitudinally extending recess on the outer face of the corresponding arm, one longitudinal edge of the recess, which edge is closer to those longitudinal edges of the arms that face one another, being formed by the rear face of the clamping surface of the arm.

4. The sealing element according to claim 1, wherein there protrudes, from the outer face of at least one of the arms, a web which extends parallel to the longitudinal axis and forms, between itself and the outer face of the corresponding arm.

5. The sealing element according to claim 1, wherein the sealing element consists of an electrically conductive material.

6. The sealing element according to claim 1, wherein an electrically conductive coating is applied to its outer face, including the seals.

7. The sealing element according to claim 6, wherein the electrically conductive coating is vapour-deposited.

8. The sealing element according to claim 1, wherein the sealing element is designed as a 2C extruded part.

9. A sealing system for hollow sections, comprising:
   at least two sealing elements according to claim 1; and
   at least one cover cap which is provided, on its outer face, with one or more sealing sections which are constructed for connection to ends of the seals belonging to the sealing element.

10. The sealing system according to claim 9, wherein the cover cap, including its sealing sections, consists of an electrically conductive material.

11. The sealing system according to claim 9, wherein the cover cap consists of an electrically conductive coating applied to the outer face of the cover cap, including its sealing sections.

12. The sealing element according to claim 1, wherein the clamping device is configured to detachably secure the sealing element on a corner.

* * * * *